(12) United States Patent
Sunkara et al.

(10) Patent No.: US 7,819,974 B2
(45) Date of Patent: *Oct. 26, 2010

(54) GROWTH OF TEXTURED GALLIUM NITRIDE THIN FILMS AND NANOWIRES ON POLYCRYSTALLINE SUBSTRATES

(75) Inventors: Mahendra Kumar Sunkara, Louisville, KY (US); Hari Chandrasekaran, Louisville, KY (US); Hongwei Li, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 632 days.

This patent is subject to a terminal disclaimer.

(21) Appl. No.: 11/824,934

(22) Filed: Jul. 3, 2007

(65) Prior Publication Data

US 2008/0194085 A1    Aug. 14, 2008

Related U.S. Application Data

(63) Continuation of application No. 10/427,747, filed on Apr. 30, 2003, now Pat. No. 7,238,232.

(60) Provisional application No. 60/376,492, filed on Apr. 30, 2002.

(51) Int. Cl.
    $C30B\ 25/12$    (2006.01)
(52) U.S. Cl. .............. 117/92; 117/88; 117/89; 117/95; 117/952
(58) Field of Classification Search ............ 117/88, 117/89, 92, 95, 952
    See application file for complete search history.

(56) References Cited

U.S. PATENT DOCUMENTS

| | | | |
|---|---|---|---|
| 7,238,232 B1 * | 7/2007 | Sunkara et al. | 117/92 |
| 2003/0039602 A1 * | 2/2003 | Sharma et al. | 423/349 |
| 2004/0003495 A1 * | 1/2004 | Xu | 29/832 |

* cited by examiner

Primary Examiner—Robert M Kunemund
Assistant Examiner—Matthew J Song
(74) Attorney, Agent, or Firm—Stites & Harbison, PLLC; Terry L. Wright

(57) ABSTRACT

A synthesis route to grow textured thin film of gallium nitride on amorphous quartz substrates and on single crystalline substrates such as c-sapphire and polycrystalline substrates such as pyrolytic boron nitride (PBN), alumina and quartz using the dissolution of atomic nitrogen rather than molecular nitrogen to allow for growth at subatmospheric pressure.

19 Claims, 9 Drawing Sheets

GROWTH OF TEXTURED GALLIUM NITRIDE THIN FILMS AND NANOWIRES ON POLYCRYSTALLINE SUBSTRATES

This application is a Continuation application of U.S. Pat. No. 7,238,232 issued on Jul. 3, 2007 from Ser. No. 10/427,747 filed on Apr. 30, 2003 and claims priority form U.S. Provisional Application Ser. No. 60/376,492 filed on Apr. 30, 2002 both of which are incorporated by reference herein in their entirety. Reference to documents made in the specification is intended to result in such patents or literature cited are expressly incorporated herein by reference, including any patents or other literature references cited within such documents as if fully set forth in this specification.

This application is part of a government project. The research leading to this invention was supported by a Grant Number CTS 9876251 from the US Air Force. The United States Government retains certain rights in this invention.

BACKGROUND OF THE INVENTION

1. Field of the Invention

The invention relates to the field of providing a synthesis technique to grow a film or small wire of gallium nitride on amorphous quartz substrates and on single crystalline substrates such as c-sapphire and polycrystalline substrates.

2. Description of the Prior Art

Gallium nitride (GaN) is a direct, wide band gap semiconductor that finds applications in light emitting diodes (LED), laser diodes (LD), high temperature/power field effect transistors (FET) and UV optical devices. Since both GaN substrates and lattice matched substrates are unavailable, heteroepitaxy on substrates such as sapphire or SiC is currently employed using metal organic chemical vapor decomposition (MOCVD), Molecular beam epitaxy (MBE) or Hydride vapor phase epitaxy (HVPE) techniques. The lattice mismatch and different thermal expansion coefficients between GaN and substrates cause high density of dislocations and stresses in the film. Lateral Epitaxial Overgrowth (LEO) and Pendeo-epitaxy have achieved significant reduction in the dislocation density, however homoepitaxy on high quality GaN substrates would be preferred.

Bulk gallium nitride growth under high nitrogen pressure (~kbars) from gallium melt has low dislocation densities ($10^6$ $cm^{-2}$), but the area of these crystals remains at about 3 $cm^2$. Bulk nucleation and growth of GaN from gallium melt at sub atmospheric pressure had been demonstrated using atomic nitrogen. However this process produced epitxial growth on (0001) single crystal sapphire substrate and has dislocation density in excess of $10^6$ $\mu cm^{-2}$.

SUMMARY OF THE INVENTION

A synthesis route to grow textured thin film of gallium nitride on amorphous quartz substrates, on single crystalline substrates such as c-sapphire, and on polycrystalline substrates such as pyrolytic boron nitride (PBN), alumina and quartz using the dissolution of atomic nitrogen rather than molecular nitrogen to allow for growth at subatmospheric pressure. The approach described here uses low pressure bulk synthesis to get large area, self oriented, high quality thin film GaN which avoids epitaxy using either tin molten gallium film as a buffer layer or directly growing on an amorphous substrate.

Thin films of liquid gallium are spread onto a single crystalline, polycrystalline or amorphous substrate, and then nitrided in an ECR-MW nitrogen plasma environment. Since nitrogen containing gallium melts wet solid surfaces very well, the flow of nitrided gallium melts will allow growing GaN platelets crystals to self-orient with respect to each other. The self-alignment of GaN crystals occurs parallel to the flow direction and the growing platelets join together by self-assembly process (FIG. 1). This process is essentially independent of substrates.

For the amorphous quartz substrates and the single crystalline substrates the method involves cleaning the substrates with hot KOH and acetone and then blowing dry with argon. Around 10 μm thick gallium was spread onto the substrates. The experiments were performed in a water-cooled double wall vacuum chamber with an ASTeX Model AX4500 ECR plasma source. $H_2$ plasma at room temperature was used for about 30 minutes to remove oxide. Subsequently, the gallium film is exposed to $N_2$ plasma and heated to 900-1000° C. by the Boralectric heater for 1-3 hours at a pressure of 100 mTorr.

About 1 μm thick gallium was also spin-coated on 2-inches quartz wafers. Similar conditions were performed except that the temperature used for this spin-coated gallium was about 800° C. and the pressure was 140 mtorr.

For polycrystalline substrates the method involves using a flat piece of PBN cleaned with hydrogen fluoride (HF) solution, ultra sonicating in acetone, and covering with a thin liquid gallium film which is resistively heated to a temperature of 900 degrees C. and exposed to ECR-MW generated nitrogen plasma environment. Nitrogen dissolves in the liquid gallium, precipitating out of the solution as GAN crystals. The GAN crystals self-orient with one another to form a uniform texture. Upon reduction to 2 microns the film is grown along with GAN nanowires.

By utilizing the dissolution of atomic nitrogen into a gallium melt, the partial pressure required to achieve equilibrium of reaction is several orders of magnitude lower for atomic nitrogen compared to molecular nitrogen. Hence the growth can be achieved at sub-atmospheric pressure.

Self-oriented, textured, thin film growth can be achieved even on polycrystalline substrate. This has a distinct advantage over all vapor phase epitaxial deposition techniques that depend heavily on the lattice matching with the substrate material.

Because of the low vapor pressure, no corrosive gallium source is used.

It is an object of the present invention to control over the thickness of the gallium melt.

It is another object of the present invention to promote pyrolytic boron nitride wetting by liquid gallium for very thin gallium films.

It is another object of the present invention to obtain uniform temperature distribution across the gallium film causes undesired fluid patterns.

Other semiconductors materials may be synthesized according to the methods of this invention. In each case, gallium or indium metal is used as the absorption sit-catalyst. Where the substrate is not readily vaporized to provide a gaseous reactant, a vapor substrate will be added to the reactive atmosphere. For example, GaAs substrates may be used, with a gallium drop and nitrogen in the gas phase, to grow GaN nanofibers.

Moreover, self-oriented GaN films were obtained by direct nitridation at low pressures on both fused quartz and single crystalline sapphire substrates covered with gallium melt. Gallium nitride crystals nucleated out of the nitrogenated gallium and self-oriented GaN film. This process of using a very thin molten gallium layer as a buffer makes this process uniquely substrates independent. Raman active optical phonon modes were observed for wurtzite gallium nitride with a FWHM 3 $cm^{-1}$. Nanocrystalline gallium nitride thin film formed on top of quartz wafer due to high nucleation density in very thin spin-coated gallium. Cross section HRTEM showed a sharp interface between gallium nitride and quartz substrates.

These and other objects of the present invention will be more fully understood from the following description of the invention.

BRIEF DESCRIPTION OF THE DRAWINGS

A better understanding of the present invention will be had upon reference to the following description in conjunction with the accompanying drawings in which like numerals refer to like parts throughout the several views and wherein.

DESCRIPTION OF THE PREFERRED EMBODIMENT

This method uses low pressure bulk synthesis to get large area, self oriented, high quality thin film GaN which avoids epitaxy using either tin molten gallium film as a buffer layer or directly growing on an amorphous substrate.

Figure 1:
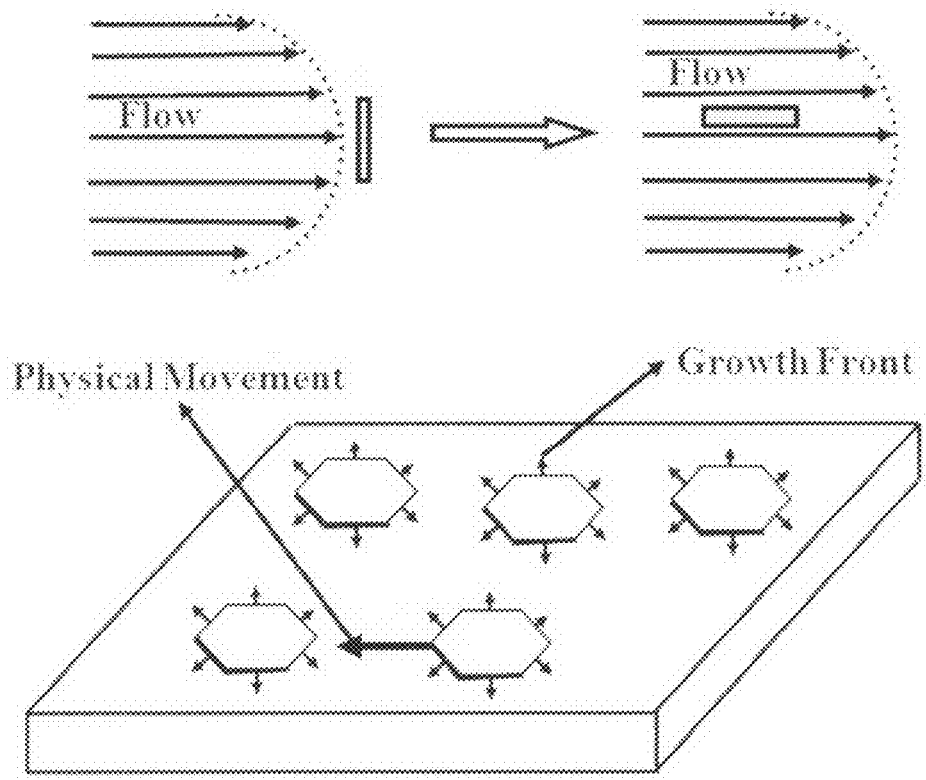
FIG. 1 shows the self-oriented growth of GaN platelet shaped crystals in flowing Ga melts.
Figure 2:
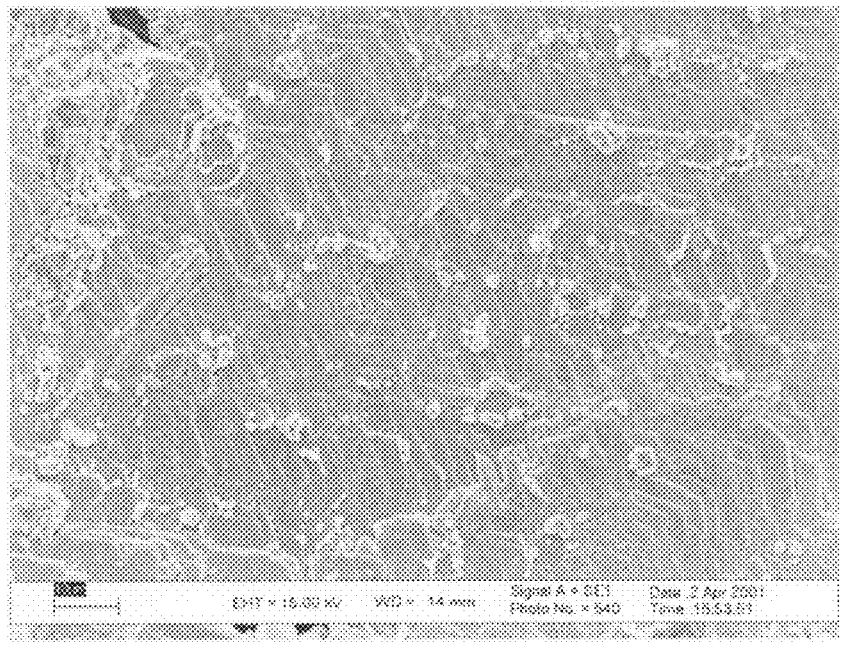
FIG. 2 shows a thin film of gallium nitride on a polycrystalline substrate.
Figure 3:
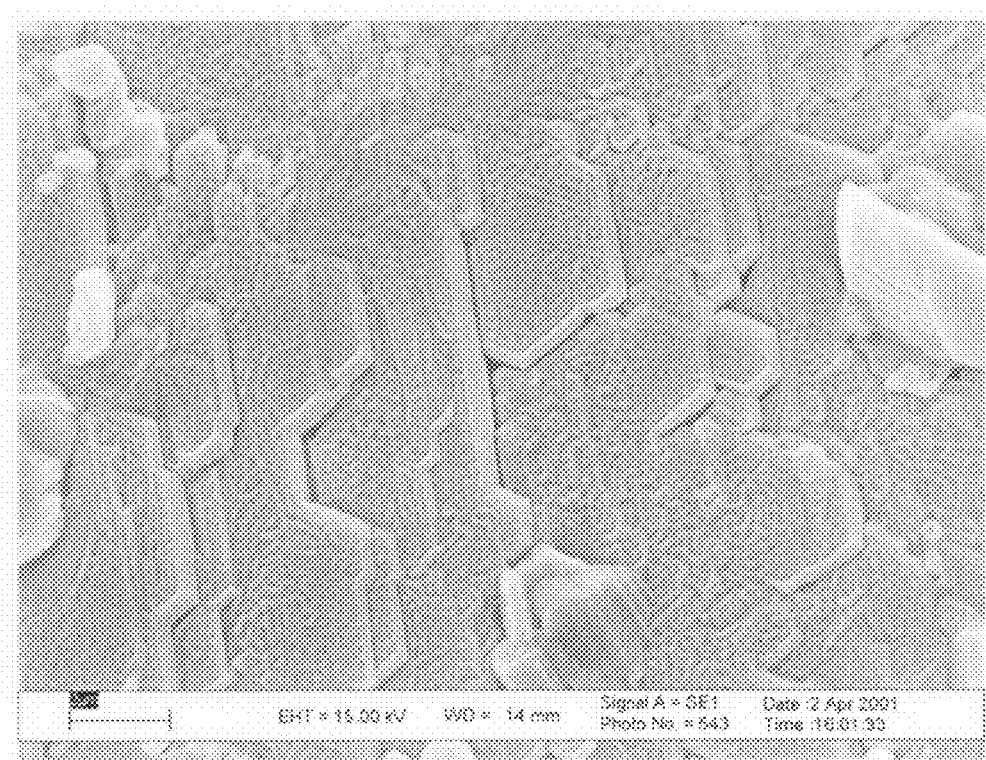
FIG. 3 shows a thin film of gallium nitride on a polycrystalline substrate.
Figure 4:
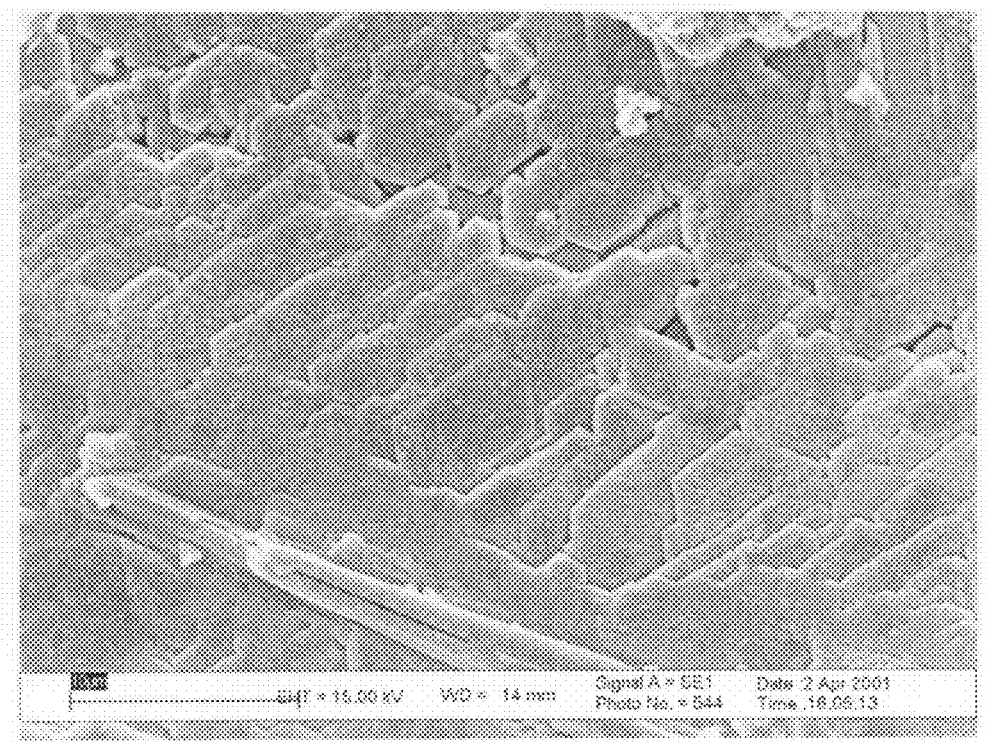
FIG. 4 shows a thin film of gallium nitride on a polycrystalline substrate.
Figure 5:
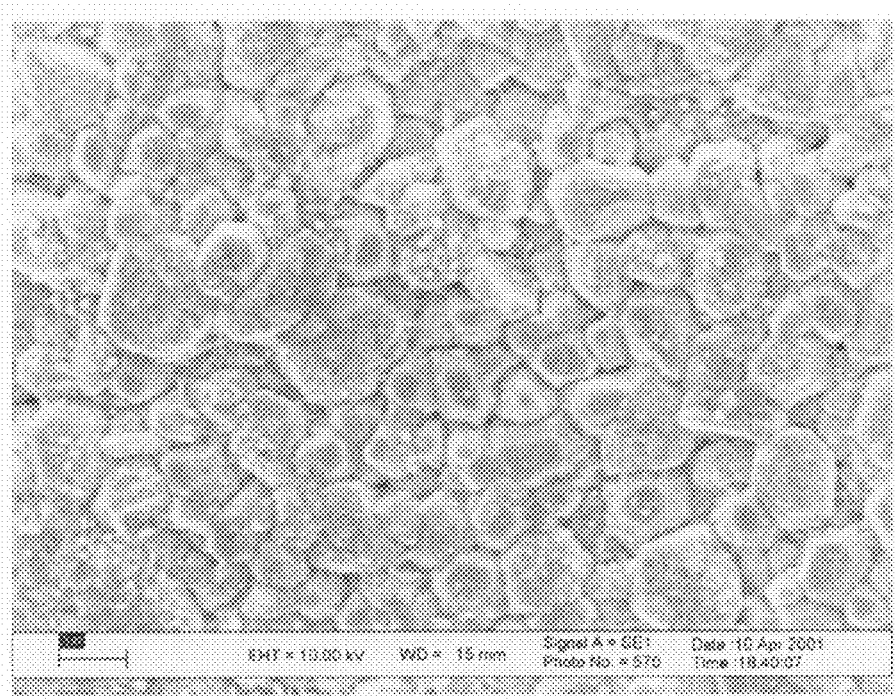
FIG. 5 shows a thin film of gallium nitride on a polycrystalline substrate.
Figure 6:
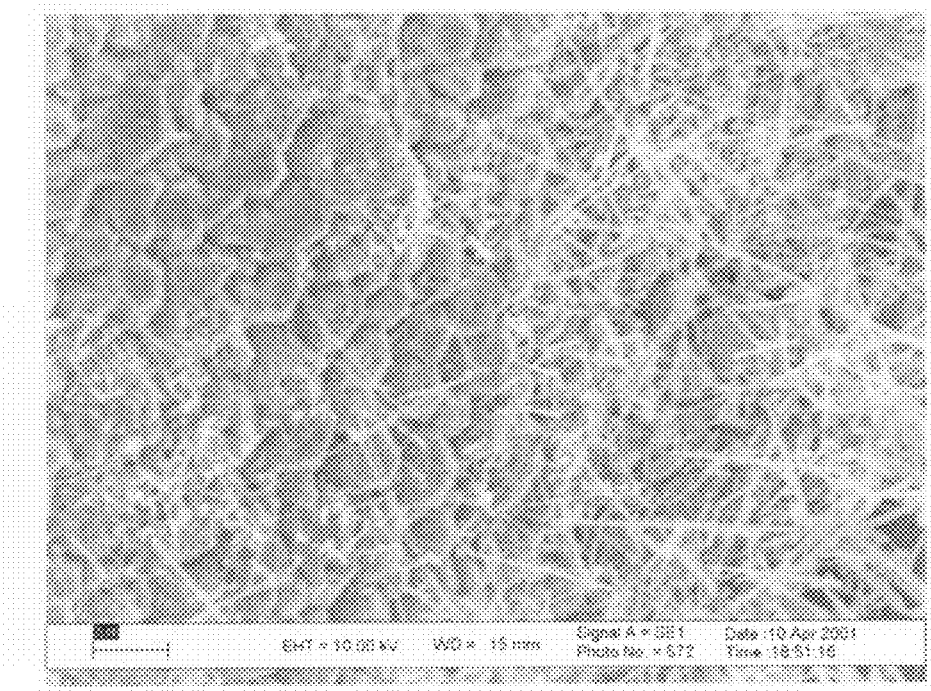
FIG. 6 shows nanowires of gallium nitride on a polycrystalline substrate.
Figure 7:
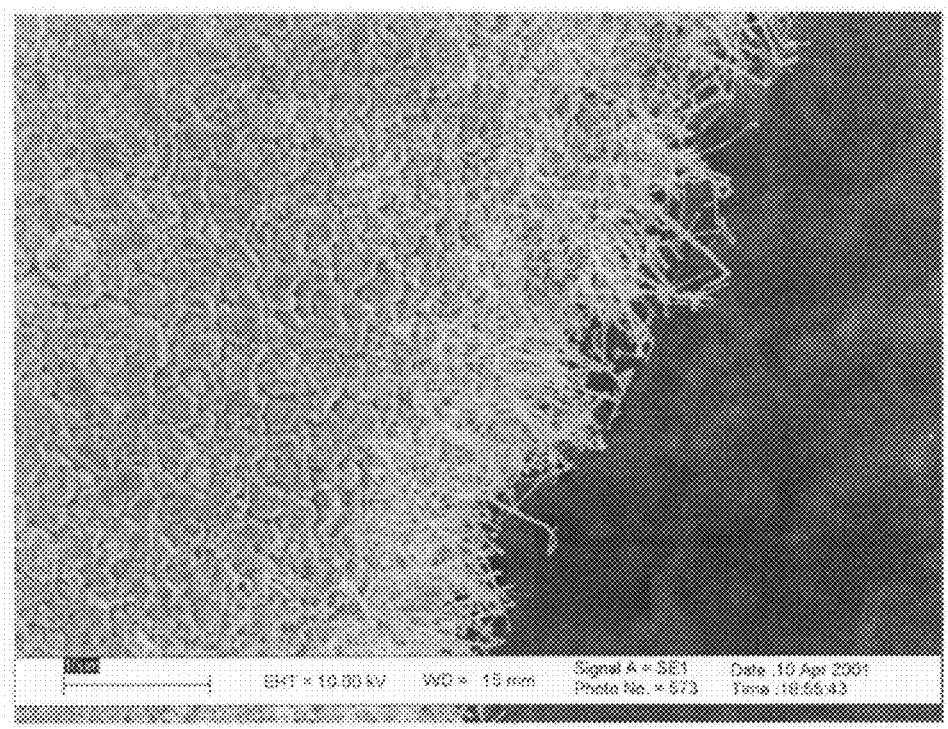
FIG. 7 shows nanowires of gallium nitride on a polycrystalline substrate.
Figure 8:
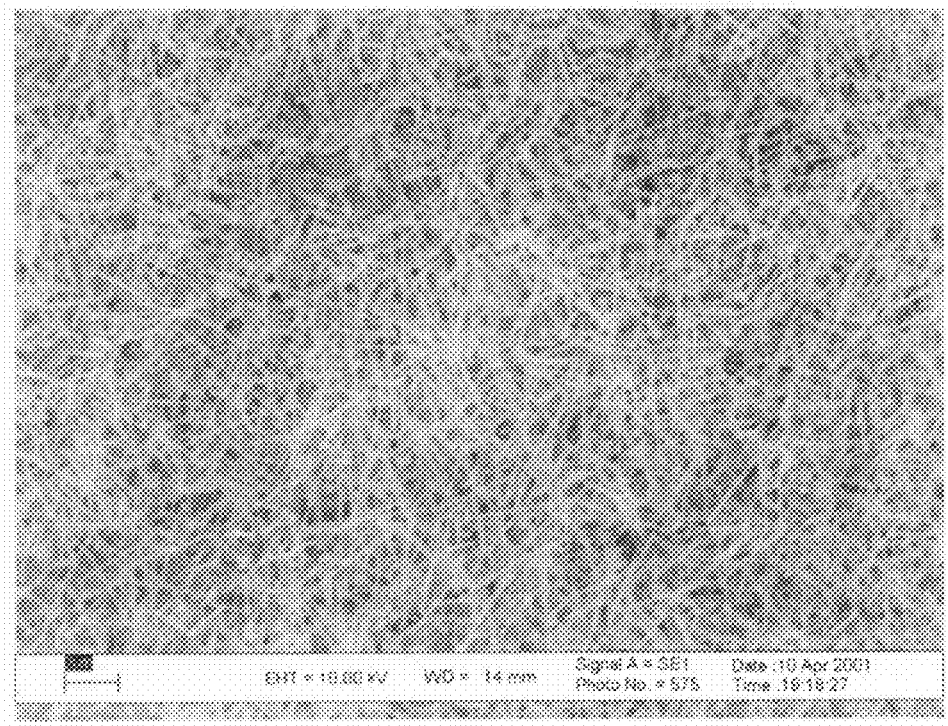
FIG. 8 shows nanowires of gallium nitride on a polycrystalline substrate.
Figure 9:
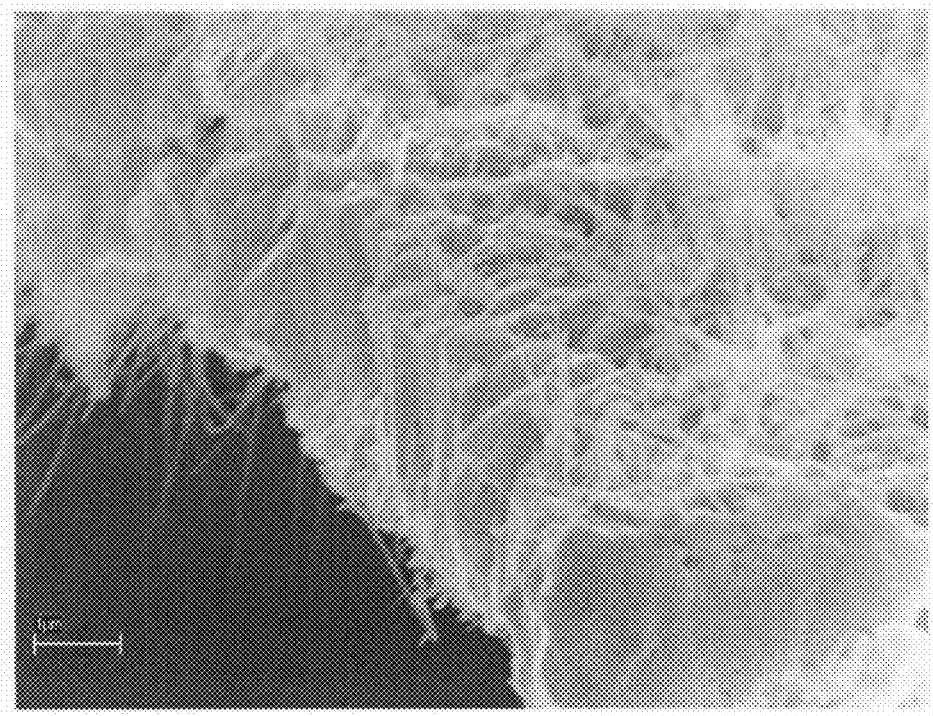
FIG. 9 shows nanowires of gallium nitride on a polycrystalline substrate.
Figure 10:
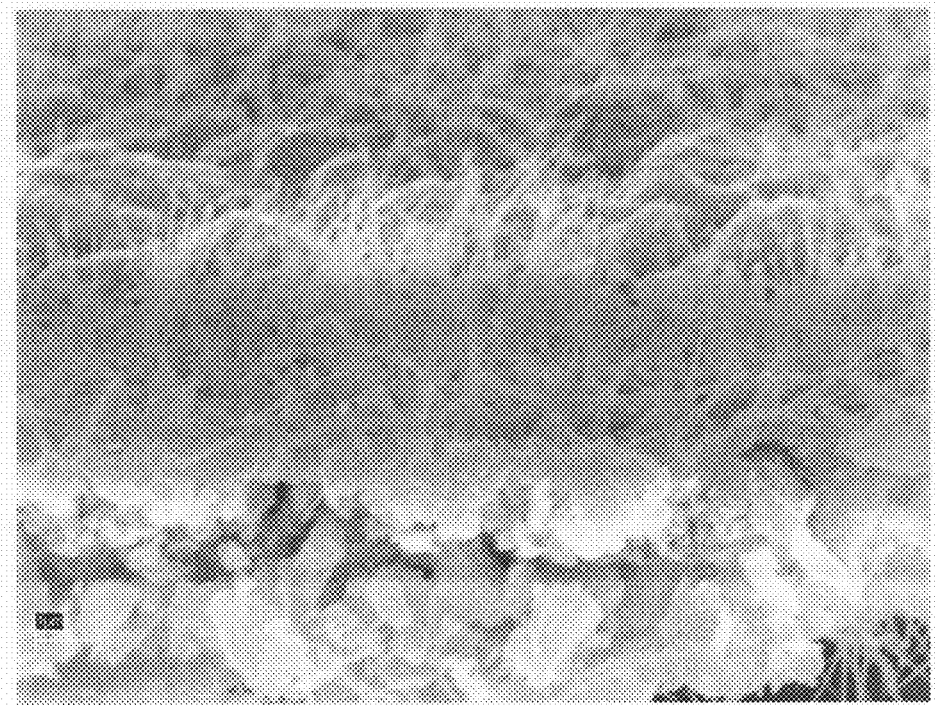
FIG. 10 shows nanowires of gallium nitride on a polycrystalline substrate.

Thin films of liquid gallium are spread onto a single crystalline, polycrystalline or amorphous substrate, and then nitrided in an ECR-MW nitrogen plasma environment. Since nitrogen containing gallium melts wet solid surfaces very well, the flow of nitrided gallium melts will allow growing GaN platelets crystals to self-orient with respect to each other. The self-alignment of GaN crystals occurs parallel to the flow direction and the growing platelets join together by self-assembly process (FIG. 1). As mentioned above, this process is essentially independent of substrates.

Self Oriented GaN Growth on Polycrystalline Substrates

A novel synthesis route is provided to grow textured thin film of gallium nitride (GaN) on polycrystalline substrates such as pyrolytic boron nitride (PBN), alumina and quartz. To grow textured gallium nitride thin film, a flat piece of PBN was cleaned with a 45% HF solution and ultra-sonicated in acetone before being covered with thin liquid gallium film. This gallium film was resistively heated to a temperature of 900° C. and exposed to ECR-MW generated nitrogen plasma environment. Several methods for accurate temperature measurement are presently being investigated. Nitrogen dissolved in liquid gallium, which precipitates out of the solution as GaN crystals. The GaN crystals self-orient with one another to form a uniform textured thin film as shown in FIGS. 2-5. The GaN crystal size after a typical growth experiment was 5-10 microns. The thickness of gallium film on the substrate determines the texture of the resulting GaN film.

When the thickness of the gallium film was reduced to 2 microns, a textured thin film of GaN was grown along with GaN nanowires. These nanowires were single crystalline, straight and defect free, with diameters varying from 40-60 nanometers and an aspect ratio of 10-20, as shown in FIGS. 6-10.

Self Oriented GaN Growth on the Amorphous Quartz Substrates

The film of gallium on quartz substrates agglomerated into droplets with a considerable size distribution during ramping-up of the substrate temperature. These gallium droplets started to spread due to good wetting characteristic after about 10 minutes at 950° C. in nitrogen plasma. Gradually, the nitrogenated melts covered entire substrate and eventually formed a thin gray colored film. The X-ray diffraction spectrum showed primary reflections of (0002) and (0004) planes of wurtzite GaN. See FIG. 11 (a). This indicates that the GaN film is c-plane textured. SEM image in FIG. 11 (b) also confirmed that the platelet-shaped crystals are oriented in c-plane.

Figure 11:
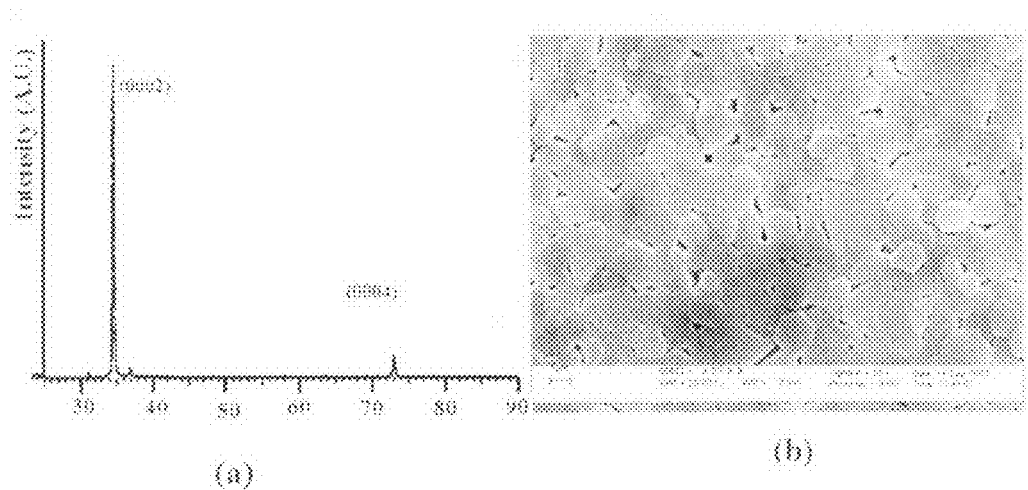
FIG. 11 shows (a) XRD spectrum and (b) SEM image of oriented GaN Quartz.
Figure 12:
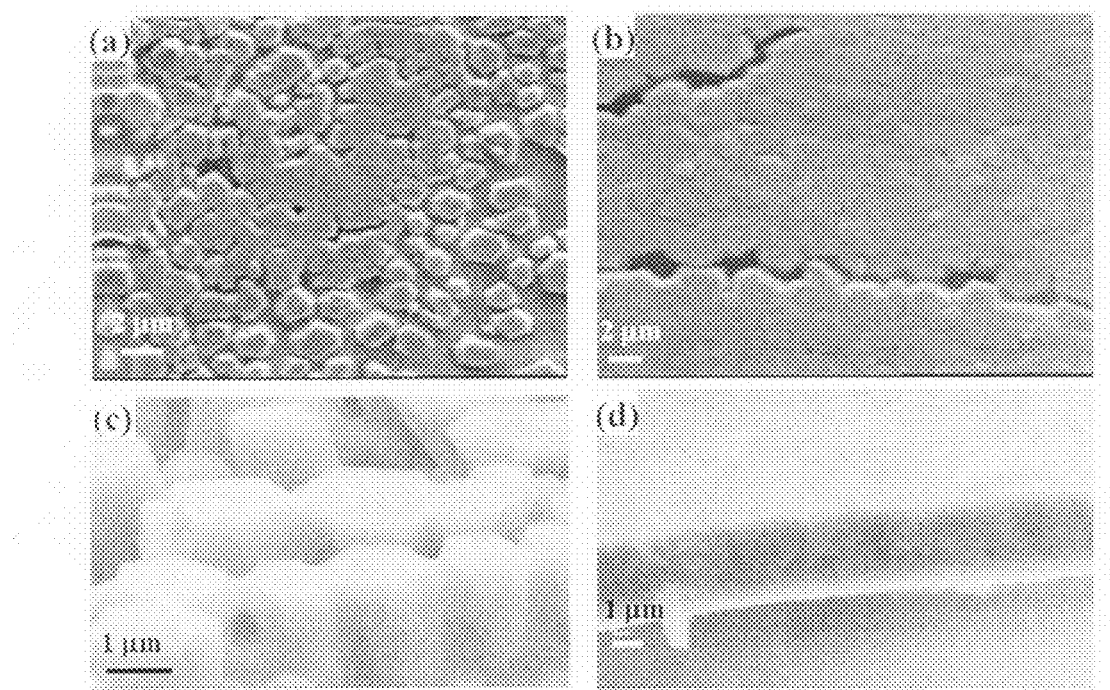
FIG. 12 shows sequential growth of self-oriented GaN film on Quartz substrates.

Gallium nitride crystals nucleated from molten gallium and self-oriented with respect to each other due to the mobility of molten gallium. Crystals grew laterally and joined together to form oriented film. The boundaries between some platelets were hardly seen due to complete joining, as shown in FIG. 11 (b). The joining of adjacent crystals was clearly shown in the top view and cross sectional images of the GaN film in FIG. 12.

Figure 13:
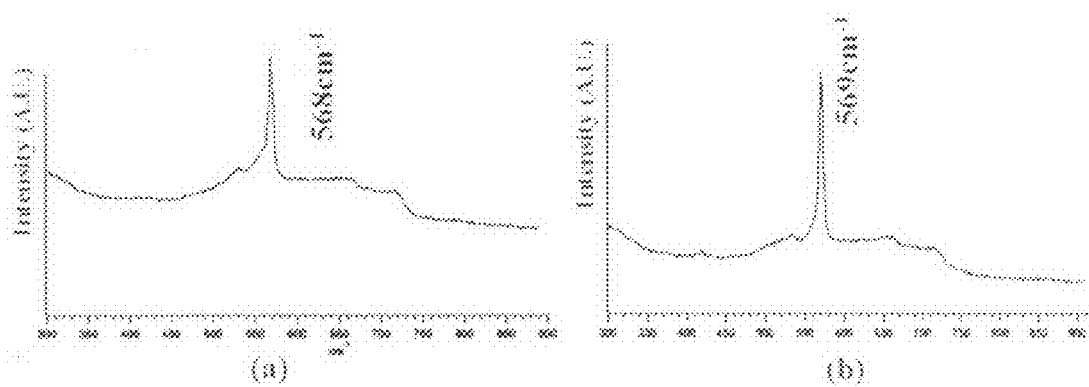
FIG. 13 shows Raman spectra of self-oriented GaN film on (a) amorphous quartz and (b) sapphire.

A Raman spectrum in FIG. 13(a) was obtained from the thin film on quartz substrates and showed predominant $E_2^{(2)}$ peak at 568 cm$^{-1}$ corresponding to wurtzite GaN. This indicates that there is low concentration of structural defects or internal stress. The FWHM of 3 cm$^{-1}$ of this $E_2^{(2)}$ peak compares very well with the reported value of 3.5 cm$^{-1}$.

Single Crystal Quality GaN on Sapphire Substrates

Similar results were obtained with bulk GaN growth on single crystalline sapphire substrates. The gray layer formed on the sapphire became transparent after excess gallium was dissolved away in aqua regia. X-ray diffraction spectra in FIG. 14 (a) showing dominant peaks of hexagonal GaN (0002) and (0004) indicated textured GaN film. SEM images in FIG. 14 (b) also confirmed that the crystals are very well oriented with respect to each other.

Figure 14:
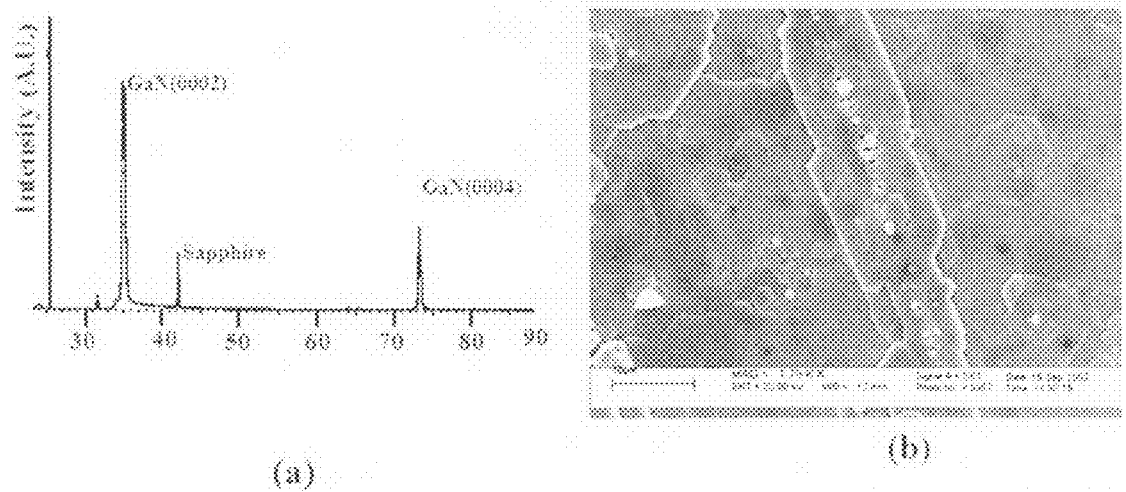
FIG. 14 shows (a) XRD spectrum and (b) SEM image of GaN on sapphire substrate.

As shown by the SEM image in FIG. 14 (b), most gallium nitride platelet shaped crystals grew and aligned along the fast growing direction. Some crystals aligned with respect to each other very well with no discernible boundaries between them. A Raman spectrum in FIG. 13(b) also indicated good quality of the resulting wurtzite GaN. The seemingly perfect orientation on the sapphire substrates could be due to two reasons. The first reason could be due to uniform lateral temperature distribution because sapphire has higher thermal conductivity (035 w/cm-K) compared to quartz (0.014 w/cm-K). The second reason could be due to occasional epitaxy of GaN crystals with sapphire substrate. Currently, TEM studies are being carried out to determine whether there was any sort of epitaxy of GaN with the substrate.

Figure 15:
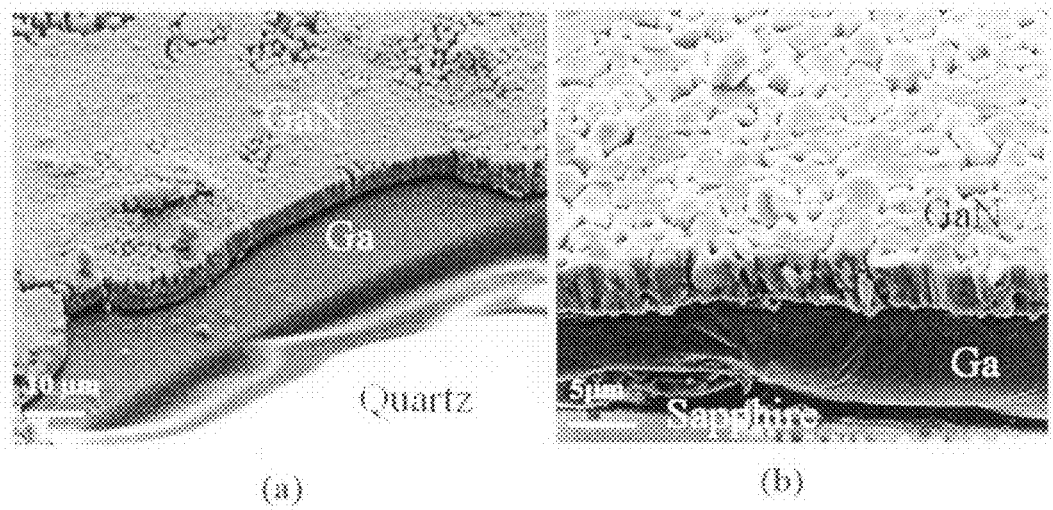
FIG. 15 shows oriented GaN film on top of gallium.

A very thin layer of gallium was found to be present in between the gallium nitride film nitride film and substrate on both quartz and sapphire substrates. See the cross-sectional SEM images in FIG. 15. This indicates gallium nitride crystals nucleated out of molten gallium and assembled freely during growth to form oriented gallium nitride film which is independent of the substrate used.

Nanocrystalline GaN Thin Film on Quartz Substrates

Figure 16:
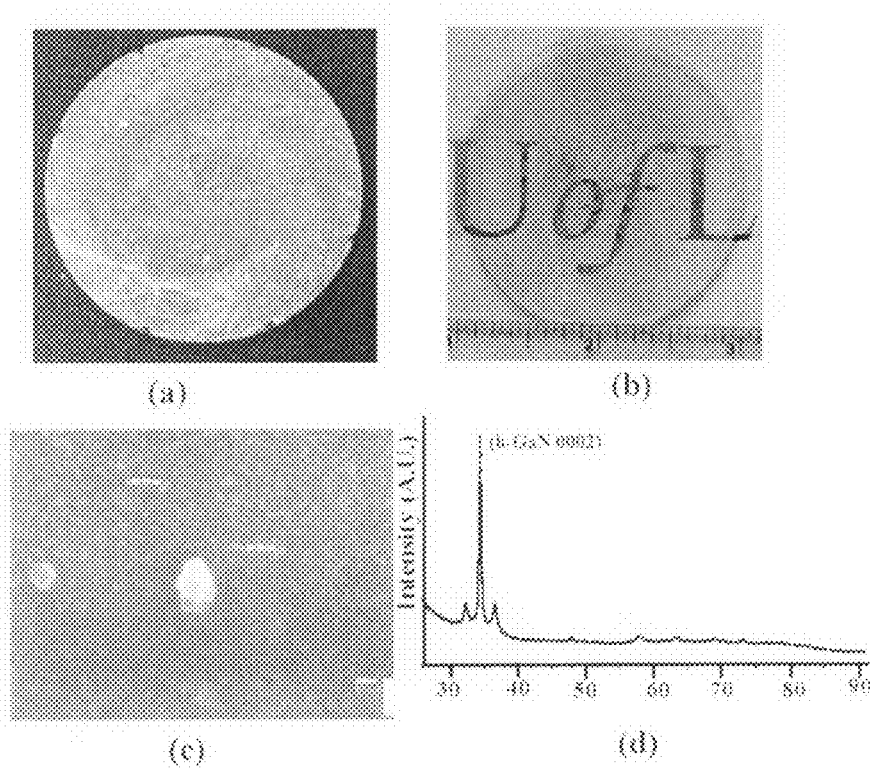
FIG. 16 shows Nanocrystalline GaN film on quartz wafer:
(a) Spin coated Ga on quartz,
(b) Yellowish GaN film on quartz, and
c) SEM image, (d) XRD spectrum.

Around 1 μm thick gallium was coated on a 2-inch quartz wafer by spinning (Shown in FIG. 16(a)). A yellowish thin film formed on the substrate after nitridation in ECR-MW generated nitrogen plasma (Shown in FIG. 16 (b)). SEM pictures in FIG. 16(c) show the size of the crystals in the film was around 85 nm. X-ray diffraction in FIG. 16 (d) indicates the film is textured. The possible reason of forming nanocrystalline GaN is the high nucleation density due to thinness of molten Ga film.

Figure 17:
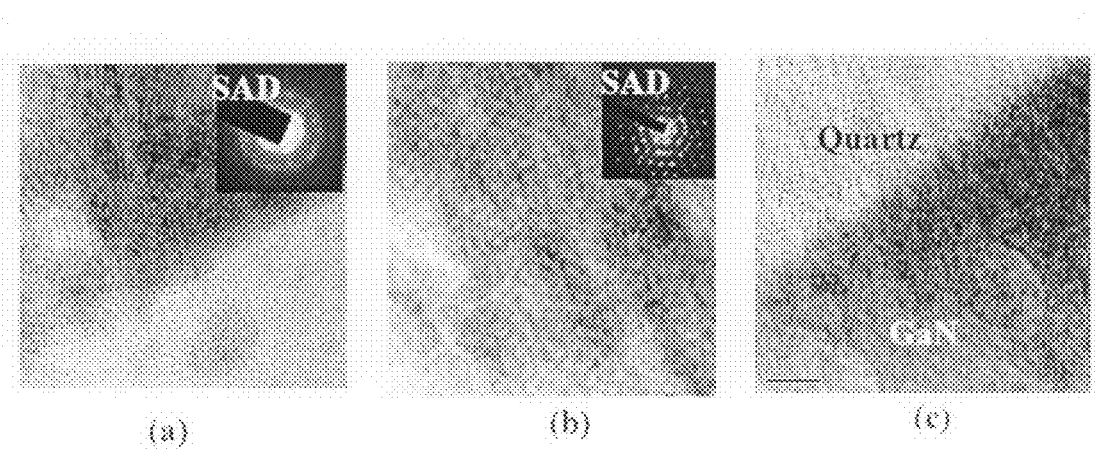
FIG. 17 shows HRTEM images of the nanocrystalline GaN film:
(a) One time growth sample,
(b) Three times growth sample, and
(c) Three times growth sample.

Cross sectional, high resolution TEM images and selected area diffraction (SAD) patterns of the film were shown in FIG. 17. From SAD of (a) and (b) it was shown that the crystal size increased after re-growth on top of one time grown GaN thin film. A sharp GaN-quartz interface was shown in FIG. 17(c) indicates no epitaxial relationship with the substrates.

Due to the high band gap, gallium nitride is used to fabricate LED based light bulbs that last up to 10 years. Bright blue LEDs are also used for flat screen displays. Long lasting blue lasers will quadruple the storage capacity of a compact disc. GaN can also serve as microwave amplifiers for wireless communications systems that translate into better reception on cell phone and fewer low-earth satellites and transmitting stations cluttering up the environment. Since GaN can operate over a wide temperature range and remain unaffected by radiation, they can be used in aerospace components. Nanometer scale semiconductor one-dimensional structures such as nanowires are expected to be very important in future high power electronics and opto-electronic device applications.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented hereinabove. Rather, what is intended to be covered is within the spirit and scope of the appended claims.

We claim:

1. A process of synthesizing a textured film of gallium nitride on polycrystalline substrates, comprising the steps of:
   using a dissolution of atomic nitrogen rather than molecular nitrogen to allow for growth at subatmospheric pressure;
   preparing a sheet of polycrystalline substrate;
   covering the sheet with a gallium film;
   resistively heating said gallium film on said sheet to a temperature of about 800-1,000 degrees C. to produce molten gallium;
   generating a nitrogen plasma environment and exposing said sheet thereto dissolving nitrogen in the molten gallium; and
   precipitating out of the solution gallium nitride crystals whereby said gallium nitride crystals self-orient with one another to form a uniform texture.

2. The process of claim 1, wherein said polycrystalline substrate is selected from the group consisting of pyrolytic boron nitride, alumina, and quartz.

3. The process of claim 1, including the step of using low pressure bulk synthesis to get a large area, self oriented, high quality film of GaN.

4. The process of claim 1, including the step of forming a film.

5. The process of claim 1, including the step of forming a wire.

6. The process of claim 1, including the step of growing GaN platelet crystals self-aligning parallel to the flow direction, said growing platelet crystals joining together by a self-assembly process.

7. The process of claim 1 including the step of spin coating about a 1 micrometer thick gallium coating on a quartz wafer.

8. The process of claim 1, wherein the thickness of gallium film on said polycrystalline substrate determines the texture of the resulting GaN film.

9. A process of synthesizing a textured film of gallium nitride on a substrate comprising the steps of:
   using a dissolution of atomic nitrogen rather than molecular nitrogen to allow for growth at subatmospheric pressure;
   preparing a substrate sheet selected from the group consisting of a single crystalline substrate, a polycrystalline substrate and an amorphous substrate;
   covering said substrate sheet with a gallium film;
   heating said gallium film on said sheet to a temperature of about 800-1,000 degrees C. to produce molten gallium;
   exposing said sheet to a nitrogen plasma environment, dissolving nitrogen in the molten gallium; and
   precipitating out of the solution gallium nitride crystals whereby said gallium nitride crystals self-orient with one another to form a uniform texture.

10. The process of claim 9, wherein heating of said gallium film is generated by ECR-MW.

11. The process of claim 9, wherein said polycrystalline substrate is selected from the group consisting of pyrolytic boron nitride, alumina, and quartz.

12. The process of claim 9, wherein said single crystalline substrate comprises a c-sapphire.

13. The process of claim 9 including the step of forming a nano film.

14. The process of claim 9, including the step of forming a nanowire.

15. The process of claim 9, including the step of growing GaN platelet crystals self-aligning parallel to the flow direction, said growing platelet crystals joining together by a self-assembly process.

16. The process of claim 9 including the step of spin coating about a 1 micrometer thick gallium coating on a quartz wafer.

17. The process of claim 9 wherein the thickness of gallium film on said substrate determines the texture of the resulting GaN film.

18. The process of claim 9, including the step of using low pressure bulk synthesis to get a large area, self oriented, high quality film of GaN.

19. The process of claim 1, wherein heating of said gallium film is generated by ECR-MW.

* * * * *